(12) United States Patent
Angelsen et al.

(10) Patent No.: US 8,063,540 B2
(45) Date of Patent: Nov. 22, 2011

(54) HIGH FREQUENCY ULTRASOUND TRANSDUCERS BASED ON CERAMIC FILMS

(75) Inventors: Bjørn A. J. Angelsen, Trondheim (NO); Tonni F. Johansen, Trondheim (NO); Helge Kristiansen, Oslo (NO)

(73) Assignee: Emantec AS, Trondheim (NO)

( * ) Notice: Subject to any disclaimer, the term of this patent is extended or adjusted under 35 U.S.C. 154(b) by 1043 days.

(21) Appl. No.: 11/074,990

(22) Filed: Mar. 8, 2005

(65) Prior Publication Data

US 2005/0194865 A1 Sep. 8, 2005

Related U.S. Application Data

(60) Provisional application No. 60/551,155, filed on Mar. 8, 2004.

(51) Int. Cl.
*H04R 17/00* (2006.01)
(52) U.S. Cl. .......................... 310/334; 310/324; 310/363
(58) Field of Classification Search .................. 310/334, 310/363, 324
See application file for complete search history.

(56) References Cited

U.S. PATENT DOCUMENTS

| | | | | |
|---|---|---|---|---|
| 4,065,734 A | * | 12/1977 | Takeno et al. | 333/150 |
| 4,506,550 A | * | 3/1985 | Sandhu | 73/603 |
| 5,071,787 A | | 12/1991 | Mori et al. | |
| 6,404,101 B1 | * | 6/2002 | Taniguchi et al. | 310/313 A |
| 6,761,692 B2 | * | 7/2004 | Angelsen et al. | 600/459 |
| 2002/0030424 A1 | * | 3/2002 | Iwata | 310/363 |
| 2003/0023169 A1 | * | 1/2003 | Angelsen et al. | 600/459 |
| 2003/0137367 A1 | * | 7/2003 | Kadota | 333/195 |

* cited by examiner

*Primary Examiner* — Thomas Dougherty
*Assistant Examiner* — Bryan Gordon
(74) *Attorney, Agent, or Firm* — Cozen O'Connor

(57) ABSTRACT

A design and a manufacturing method of ultrasound transducers based on films of ferro-electric ceramic material is presented, the transducers being particularly useful for operating at frequencies above 10 MHz. The manufacturing technique can involve tape-casting of the ceramic films, deposition of the ceramic films onto a substrate with thick film printing, sol-gel, or other deposition techniques, where manufacturing methods for load matching layers and composite ceramic layers are described. The designs also involve acoustic load matching layers that provide particularly wide bandwidth of the transducers, and also multi-band operation of the transducers. The basic designs can be used for elements in a transducer array, that provides the frequency characteristics of the single element transducers, for array steering of the focus and possibly also direction of a pulsed ultrasound beam at high frequencies and multi-band frequencies.

18 Claims, 7 Drawing Sheets a)

Figure 6

HIGH FREQUENCY ULTRASOUND TRANSDUCERS BASED ON CERAMIC FILMS

RELATED APPLICATIONS

This application claims priority from U.S. Provisional Patent Application Ser. No. 60/551,155 which was filed on Mar. 8, 2004.

BACKGROUND OF THE INVENTION

1. Field of the Invention

The present invention is directed to technology and design of efficient ultrasound transducers for high frequencies. The invention has special advantages where the highest frequencies are above 10 MHz, but has also applications for transducers at lower frequencies.

2. Description of the Related Art

Medical ultrasound imaging at frequencies above ~10 MHz, has a wide range of applications for studying microstructures in soft tissues, such as the composition of small tumors or a vessel wall. Ultrasound transducers for medical applications are currently based on ferro-electric, ceramic plates as the active material, that vibrates in thickness mode. When polarized, the materials show piezoelectric properties with efficient electromechanical coupling. However, the characteristic impedance of the ceramic material ($Z_x$~33 MRayl) is much higher than that of the tissue load material ($Z_L$~1.6 MRayl). In order to get adequate thickness vibration amplitude of the plate for efficient power coupling into the tissue load material, one must operate the plates at thickness resonance, typically $L_x=\lambda/2$ resonance. Here $L_x$ is the plate thickness, $\lambda=c_l/f$ is the wavelength of longitudinal waves normal to the plate with wave velocity $c_l$ and frequency f. The resonance makes the transducer efficient in a band of frequencies around a center frequency $f_0=c_l/\lambda_0=c_l/2L_x$. Acoustic matching plates between the ceramic plate and the load are used to improve the power coupling to the load, a technique that increases the bandwidth of the transducer resonance.

With the well known composite technique, where the ceramic plate is diced into small posts, and the interpost space is filled with polymer, the efficient characteristic impedance is reduced to ~15 MRayl, which is still around 10 times higher than the characteristic impedance of the load, such as soft tissue or water. Transducers of composite material must therefore also operate in thickness resonant mode, albeit one can obtain some wider bandwidth than with the transducers of whole ceramic.

Hence, both with whole and composite ceramic, the resonant operation requires that the plate thickness is inversely proportional to the center frequency of the operating transducer band. This requires thicknesses in the range of 200-20 μm for center frequencies in the range of 10-100 MHz. Today, lapping of the ceramic plate is the common technology to manufacture plates with correct thickness, which becomes difficult and expensive at thicknesses in ranges below 50-60 μm, corresponding to frequencies above 30-40 MHz. Composite ceramic/epoxy material is also difficult to make for frequencies above 15 MHz, and it is hence a general need for efficient methods to manufacture transducers with a functioning high frequency band above ~10 MHz.

The invention devices a solution to these problems as described below.

SUMMARY OF THE INVENTION

The invention presents a new design of ultrasound transducers where the active electromechanical coupling material is ferroelectric, ceramic films that are made piezoelectric through electric polarization. The piezoelectric layer is made either by tape casting techniques and subsequently adhered to a substrate after sintering, or by direct printing of the film onto a substrate, or growing of the films onto the substrate with sintering of the ceramic film after adhesion to the substrate. The acoustic contact between the piezoelectric plate and the load material is through the substrate, where the substrate after the adhesion of the piezoelectric films is modified into layers with descending characteristic acoustic impedance from the piezoelectric plate to the load material, so that it performs an acoustic impedance matching between the load material and the piezoelectric plate, to increase the transducer bandwidth.

A preferred substrate material is the semiconductor silicon (Si), since micro-machining manufacturing techniques for this material are well developed. The characteristic acoustic impedance of Si is 19.6 MRayl, a convenient impedance to be the acoustic matching layer closest to the transducer with Chebychef matching response. With 3 layer Chebychef matching, a second load matching layer can then be made as a composite of Si and polymer to a characteristic impedance of 7.3 MRayl, while the final matching layer close to the load is a polymer with characteristic impedance of ~2.7 MRayl. With a 2 layer Chebychef matching, the Si layer is coated with polymer with characteristic impedance ~2.7 MRayl.

For maximally flat type of matching with 3 layers to the load, a substrate based on glass or fused quartz may be used with a characteristic impedance of ~14 MRayl, which is the layer closest to the transducer. The $2^{nd}$ layer then has a characteristic impedance ~4 MRayl, which is obtained by a composite of glass and polymer with characteristic impedance of ~2 MRayl, where the $3^{rd}$ layer is polymer with characteristic impedance of ~2 MRayl.

For maximally flat type of matching with 2 layers to the load, a substrate based on Mg may be used with a characteristic impedance of ~10 MRayl, which is the layer closest to the transducer. The $2^{nd}$ layer can then be a polymer with characteristic impedance ~2.5 MRayl. A 2-layer Chebychef type of matching can be obtained with a substrate layer closest to the transducer ~13 MRayl with a matching layer closest to the load of polymer with characteristic impedance ~3 MRayl.

With thick film printing of the front electrode and ferroelectric ceramic film onto a Si-substrate, the Si substrate can first be covered with a film layer that provides sufficient diffusion isolation between the Si-substrate and the ceramic to avoid contamination of the ceramic during the sintering process with temperatures ~1000° C. Useful materials for this isolating film layer is for example a film of ceramic material or $Al_2O_3$. This isolating film layer could also be the electrode film itself. A typical electrode material for this isolation is Pt, and the electrode can typically be used as a ground electrode for the finished transducer. The hot transducer electrode (also Pt typically) is printed on the top side of the ceramic film, and can be printed into divided areas to form individual, hot electrodes of elements in a transducer array.

Electrical connection between the transducer electrodes and other circuitry, can be obtained through gluing with conducting glues. A specially convenient low cost connection technique, is to use a conducting glue composed of conducting particles with diameter ~5-10 μm dissolved with ~10 vol % in an isolating glue. Conducting humps at the connection spots provide so low distance to the opposite connector, that the conducting particles of the glue forms a connection at the humps, with low conductivity of the glue outside these connecting humps.

For dual frequency band operation of the transducer elements, a conducting paste with similar characteristic impedance as the ceramic film, can be printed on top of the Pt-electrodes, with thickness ~$\lambda/4$ for the lowest frequency band operation. In this lowest resonance band, the ceramic film is also $\lambda/4$ thick, so that the total thickness of the ceramic film and the electrode is ~$\lambda/2$ in the low resonance band. In the higher frequency resonance band, the ceramic and the electrodes are $\lambda/2$ each, so that the total thickness of the ceramic and the electrode provides $\lambda$ resonance of the transducer. Typical material for these electrodes can be a Ag/Pd mixture.

As the element electrodes of a transducer array according to this principle participate in the resonance definition of the transducer element, the separation of the electrodes provides improved acoustic isolation between the array elements, for improved array performance.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
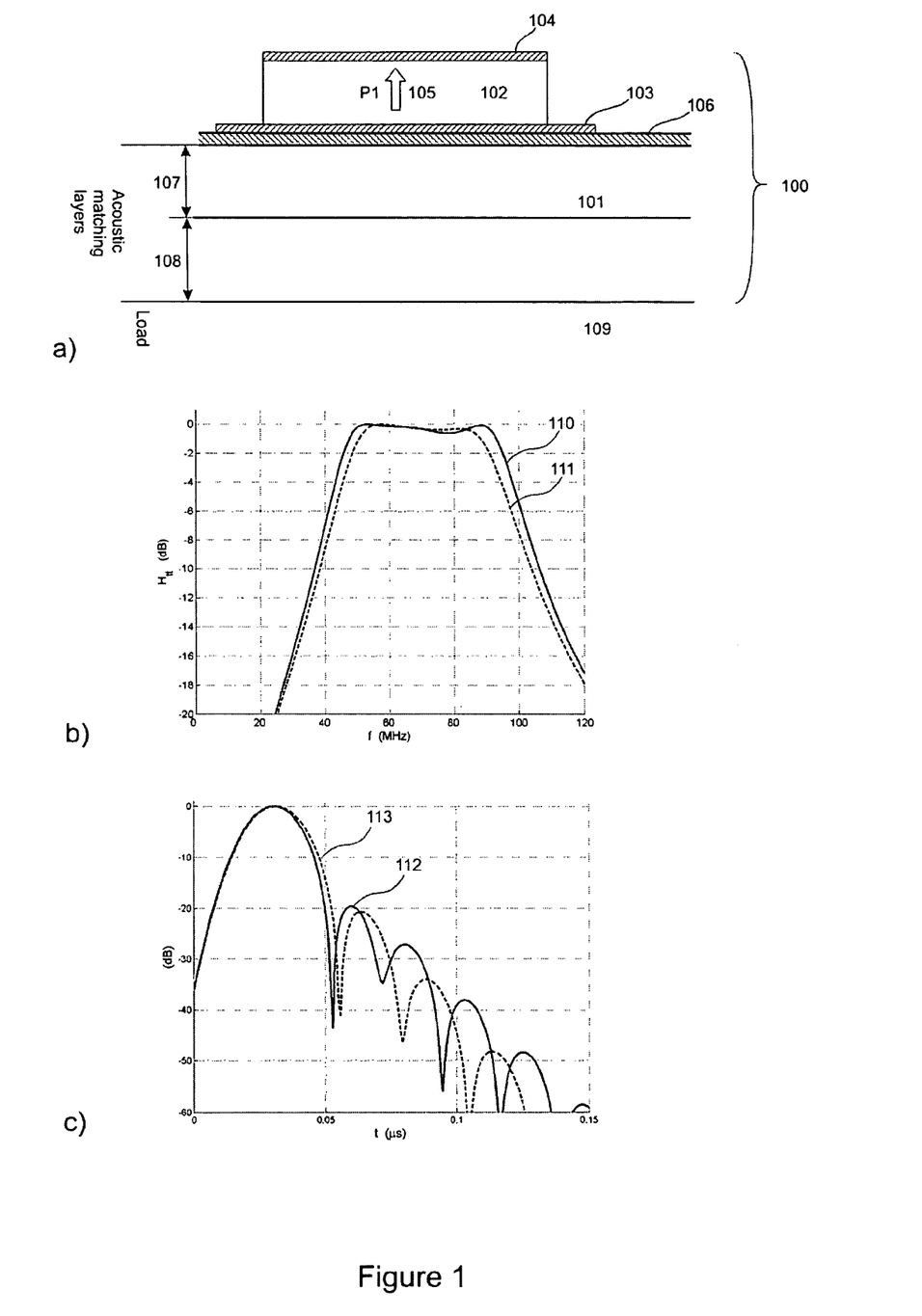
FIG. 1, show an example of a film transducer structure according to the invention with a 2-layer acoustic matching to the load material, together with example electro/acoustic transfer functions and pulse envelopes.

A cross section of an example transducer embodiment with two acoustic matching layers according to the invention, is shown in FIG. 1a. In this FIG. 100 shows a cross section of a complete transducer assembly, where 101 is a substrate, and 102 shows the ferroelectric ceramic film. The film is covered with a front electrode 103 and a back electrode 104, where the electrodes together function as an electric port to couple electric energy to the transducer vibrations. The electrodes are also used to polarize the ceramic film in the direction normal to its thickness, where the polarization direction is indicated by the arrow P1, 105. With this polarization, the ceramic film becomes piezoelectric. For best possible function of the transducer, the electrodes should be as thin as possible, with thickness preferably less than $\lambda/10$, where $\lambda$ is the wavelength of bulk waves in the thickness direction in the electrodes.

Free ceramic films with electrodes can be manufactured with tape casting techniques, sintered at ~1200° C., and adhered onto the substrate after the sintering. Adhesion of the tape-casted transducers onto the substrate can be done by gluing, ultrasound or anodic bonding techniques, etc. The ceramic films can also be thick film printed onto the front electrode on the substrate, or deposited through sol-gel techniques, and then sintered. These film deposition techniques put stronger requirements on the substrate, as the substrate must withstand the sintering temperatures, and leaves a limited group of substrates to be used.

Silicon (Si) is highly interesting for this purpose, as the characteristic acoustic impedance has an interesting value for Si to participate as an acoustic matching layer to the load impedance. There also exist well developed micro machining techniques for Si, which is very valuable for manufacturing of the acoustic impedance matching layers to the load material. Si can withstand sintering temperatures of 850-900° C., which provides adequate piezoelectric properties of the ceramic film, although not as good as when sintering at 1200° C. However, there is some problems of contamination of the ceramic film from the Si substrate, which requires that the Si substrate is covered with a diffusion blocking layer, before the printing. This phenomenon was addressed in U.S. patent application Ser. No. 10/180,990, where a solution was given by using a thick isolation film of a material with close to the same characteristic acoustic impedance as the ceramic film, so that the isolation film thickness participates in the definition of the transducer resonance frequencies. The isolation film could be made of the ceramic material itself, or other materials with close to the same characteristic acoustic impedance.

In this patent, the isolation film is made so thin that the resonance frequency is mainly defined by the piezoceramic film itself, with negligible effect of the isolation film on the transducer resonance frequencies. As the isolation film is thin, one can choose a larger group of materials for this film, where still the ferroelectric ceramic material itself is a candidate, but also alumina ($Al_2O_3$), or the conducting front electrode which then must be made sufficiently dense and thick to function as a diffusion blockage. A practical requirement is that the thickness of the front electrode and possibly added isolation film is less than $\lambda/10$, where $\lambda$ is the wave length for bulk waves in the thickness direction of the films.

In FIG. 1a is shown a separate diffusion isolation film 106 in direct contact with the substrate 101, and the front electrode 103 is printed on top of the isolation film. The front electrode is typically based on Pt, but Ag/Pd combinations are also interesting. The ceramic film 102 is then printed onto the front electrode 103 and finally the back electrode 104 is printed onto the ceramic film.

The tape casting technique allows higher sintering temperatures of the ceramic than sintering on Si, which gives better piezoelectric properties of the tape casted film. However, the lower electromechanical coupling of the film sintered at 850-900° C. is acceptable in many applications. When a tape-casted ceramic transducer is adhered to the substrate, one do not need the sintering diffusion isolation film 106. With ultrasound or anodic bonding techniques, this film layer would be missing, and with gluing it could illustrate the glue film. Since the high tempertaure sintering is not done on the substrate material, this technique allows the use of a larger group of substrates than when the substrate is sintered together with the printed film. Examples of such substrates are glass or fused silica, aluminum, and magnesium.

According to the invention, the substrate is part of the acoustic impedance coupling between the transducer and the load. For Si, glass and other substrates one can etch the substrate down to adequate thickness to function as a first acoustic matching layer 107 between the ceramic transducer and the load material 109. A second acoustic matching layer 108 can be made of polymer, for example adhered to the glass layer by spin coating techniques. Another method is to adhere a Mg film of correct thickness onto the tape-casted ceramic, before adhering the final polymer film. Both these methods provide a 2-layer acoustic impedance matching between the transducer and the load material 109.

FIG. 1b shows as the solid line (110) the electro-acoustic transfer function for a 70 MHz transducer with a glass substrate matching layer. The transfer function is from voltage over the electrodes to pressure in the transmitted wave. The ceramic film has a characteristic acoustic impedance of 33 MRayl with thickness 22 μm and acoustic propagation velocity of 4330 m/s. The ceramic film is covered with Pt electrodes of thickness 1.5 μm (104) and 2 μm (103). Pt has a characteristic acoustic impedance of 85 MRayl. The glass matching layer has a characteristic acoustic impedance of 13 MRayl and a thickness of 19 μm with an acoustic velocity of 5200 m/s, and the polymer matching layer has a characteristic acoustic impedance of 3 MRayl and a thickness of 11 μm with acoustic velocity of 3000 m/s.

The dashed line (111) in FIG. 1b shows the electro-acoustic transfer function for the same film transducer with Mg as the first matching layer (characteristic impedance of 10 MRayl, thickness 21 μm, propagation velocity of 5760 m/s) and polymer with characteristic impedance 2.5 MRayl and thickness 11 μm.

We see that the transducer has an efficient 3-dB bandwidth from 44 MHz to 97 MHz for glass substrate and 47 MHz to 93 MHz for Mg substrate, giving a center frequency of 70 MHz with 74% (glass) and 66% (Mg) relative bandwidth. The envelope of a typical pulse is shown in FIG. 1c where the solid line 112 represents glass matching and the dashed line 113 represents Mg matching. The pulses have a −15 dB duration of 38 nsec (glass) and 40 nsec (Mg) with a $1^{st}$ temporal tail lobe that is 19 dB (glass) and 21 dB (Mg) below the main lobe, giving a −25 dB pulse duration of 62 nsec (glass) and 67 nsec (Mg).

Figure 2:
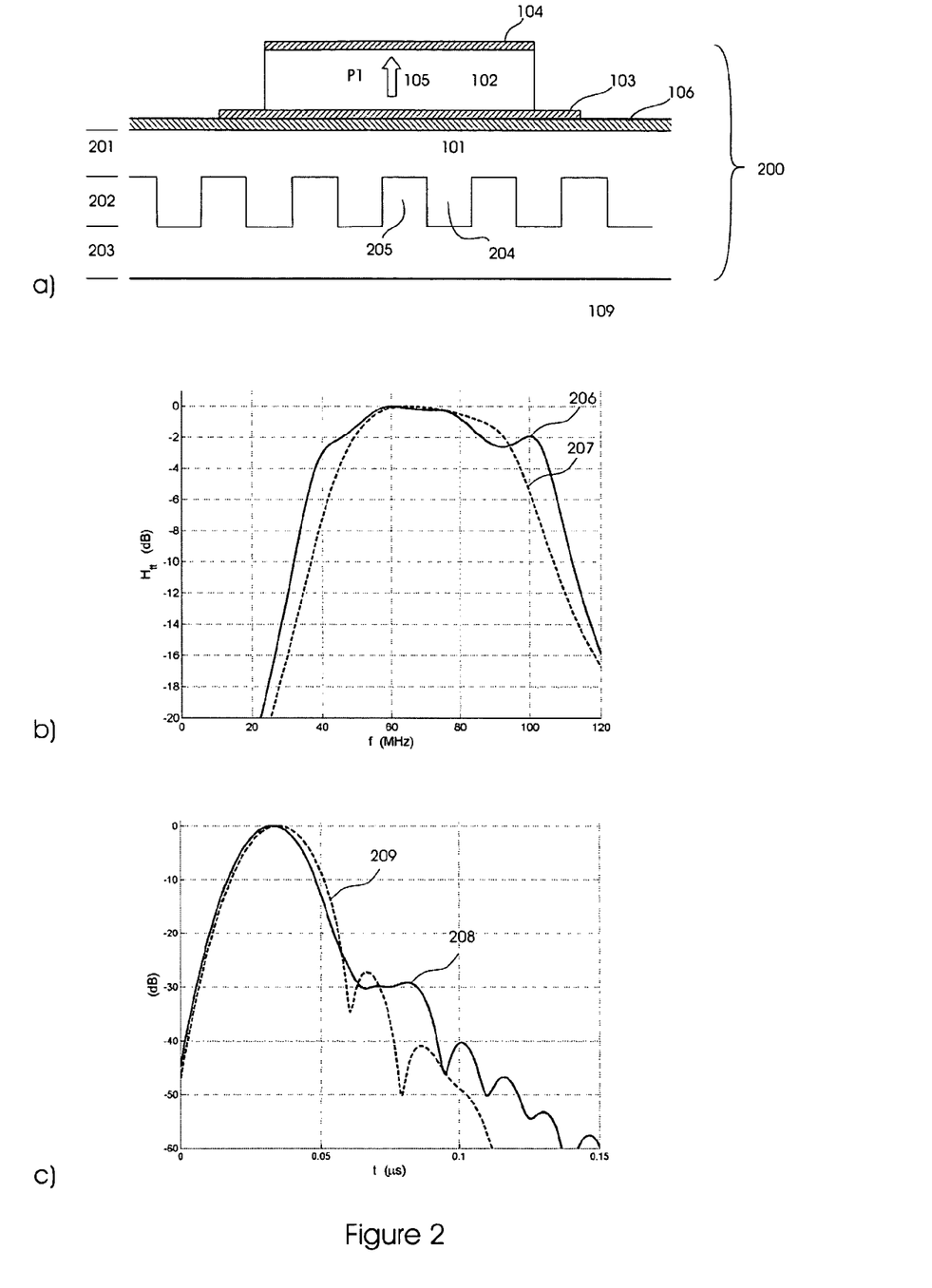
FIG. 2, show an example of a film transducer structure according to the invention with a 3-layer acoustic matching to the load material, together with example electro/acoustic transfer functions and pulse envelopes.

Wider bandwidths can be obtained with a 3-layer acoustic matching as illustrated in FIG. 2a where 200 indicates the complete transducer assembly including acoustic impedance matching layers to the load. As in FIG. 1a, 102 shows the ceramic film with the electrodes 103 and 104 adhered to the substrate 101 with the isolation film 106. The transducer has three acoustic matching layers 201, 202, and 203 between the ceramic film and the load, where 201 is made of bulk substrate material, 202 is made as a composite of the substrate material and polymer, and 203 is made of bulk polymer.

The matching layers are made in a first step by plane etching, or grinding, or other, of the substrate down to the total thickness of layers 201 and 202. In a second step, the substrate is further etched to form voids 205 in located regions so that one in these regions are left with the thickness of layer 201 while the remnant substrate material 204 sticks out with the thickness of the layer 202. Polymer is then adhered to fill the voids 205 in layer 202 and to build layer 203 to correct thickness, for example using spin coating techniques. Hence, the $2^{nd}$ layer (202) is build as a composite of polymer and the substrate material, where the relative volume fill of these materials defines the characteristic impedance of this layer, according to known principles.

With this method, both a 3-1 composite and a 2-2 composite can be built, as illustrated in FIGS. 2d and 2e respectively. In FIG. 2d, the voids 205 in layer 202 are etched in a continuous pattern, leaving the remnant substrate material as posts 204, so that a 3-1 composite is formed when the voids are filled with polymer. In FIG. 2e, the voids 205 are etched in a two-dimensional pattern (depth and length) leaving the remnant substrate material as 2-dimensional stripes 204 to form a 2-2 composite. The Figure shows the pattern as linear stripes, but a 2-2 composite could also be formed by etching the voids as circles, for improved performance with an annular array.

The 3-layer matching is conveniently used with a Si-substrate, where the ceramic films are either thick film printed onto the substrate before sintering as described above, or by adhering a tape casted ceramic film onto the Si substrate. Anodic bonding of the ceramic transducer to the substrate is then interesting. An Si substrate is particularly interesting because one have well defined etching methods to manufacture the voids/posts 205/204 for the $2^{nd}$ matching layer 202 in FIG. 2a.

An example electro-acoustic transfer function from voltage across the electrodes to the pressure in the wave in the load, is shown as the solid line (206) in FIG. 2b. The ceramic layer and electrodes are the same as for the transfer functions in FIG. 1b, while the $1^{st}$ λ/4 matching layer (201) made of crystalline Si has a characteristic impedance of 19.6 MRayl and a thickness of 31 μm and acoustic propagation velocity of 8440 m/s. The $2^{nd}$, composite λ/4 matching layer (202) has a characteristic impedance of 7.3 MRayl and a thickness of 20 μm with a propagation velocity of 5500 m/s, while the $3^{rd}$λ/4 matching layer made of polymer has a characteristic impedance of 2.7 MRayl and thickness of 9 μm with a propagation velocity of 2400 m/s.

We note that the transfer function has an efficient band width from 40 MHz to 104 MHz providing a center frequency of 72 MHz with a relative 3-dB bandwidth of 89%. The envelope of the impulse response for this structure is shown as the solid line (208) in FIG. 2c, where we note the −15 dB duration of the main lobe is 35 nsec, the $1^{st}$ temporal sidelobe pulse tail is −30 dB below the main lobe, and the −35 dB duration of the pulse is 86 nsec.

With sputter etching, or a combination of chemical and sputter etching, it is possible to create voids/posts 205 and 204 also in a glass substrate. The dotted line 207 in FIG. 2b shows the electro-acoustic transfer function with the same ceramic film and electrodes for a 3-layer load matching build on glass, where the first glass λ/4 layer has a characteristic acoustic impedance of 14 MRayl and thickness of 21 μm with an acoustic propagation velocity of 5610 m/s, the $2^{nd}$ composite λ/4 layer has a characteristic impedance of 4 MRayl and thickness of 12 μm with an acoustic propagation velocity of 3300 m/s, and the $3^{rd}$ polymer λ/4 layer has a characteristic impedance of 2 MRayl and a thickness of 11 μm and an acoustic propagation velocity of 3000 m/s.

We note that the transfer function has an efficient band width from 47 MHz to 95 MHz providing a center frequency of 71 MHz with a relative 3-dB bandwidth of 68%. The envelope of the impulse response for the glass substrate is shown as the dotted line 209 in FIG. 2c, where we note the −15 dB duration of the main lobe is 40 nsec, the pulse tail is −27 dB below the main lobe, and the −35 dB duration of the pulse is 70 nsec. We note that even if the relative band width of the 3-layer glass matching has not increased from the 2-layer glass matching, the pulse length is reduced.

We note that the glass substrate produces less ripple in the electro-acoustic transfer function and lower tail in the impulse response. However, the difference is so low that the Si substrate is preferred in many situations due to more developed micro machining techniques.

Figure 3:
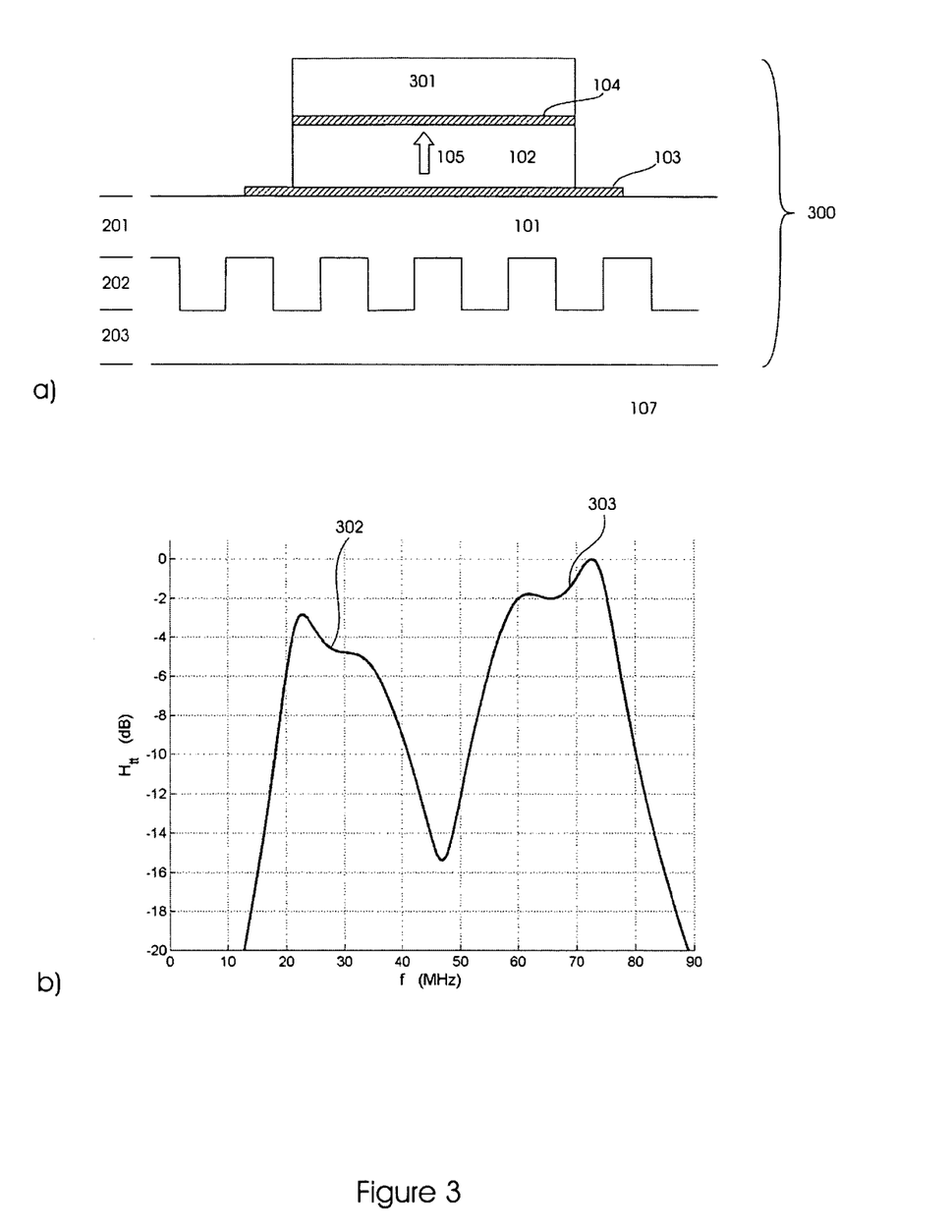
FIG. 3, shows an example of a film transducer according to the invention with a multi-band operation.

A multiband operation of the transducer can be obtained by adding another layer at the back of the transducer, with close to the same characteristic impedance as the ceramic, as shown in FIG. 3a, where 300 indicates the complete transducer assembly. This Figure shows the same transducer and matching structure as in FIG. 2a, with the added layer 301 at the back-side of the structure. A typical electro-acoustic transfer function from the voltage between the electrodes to the vibration velocity in the load material, is shown in FIG. 3b. The transfer function has a lower efficient band 302 from 20 MHz to 35 MHz, and a higher efficient band 303 from 58 MHz to 76 MHz. The total efficient band is 117% around a center frequency of 48 MHz. However, the whole band can not be accessed with one single wide-band pulse, rather one can use the transducer for pulses with center frequencies ~25 MHz and ~70 MHz.

With the low frequency pulse one can produce a less resolution image with deeper penetration, and switching to the high frequency band one can obtain a higher resolution image for objects at closer range. The dual band is also interesting for harmonic imaging where one transmits a pulse with center frequency ~30 MHz, and receives a $2^{nd}$ harmonic band of this pulse around ~60 MHz. One can even transmit a pulse with center frequency ~22 MHz and receive a $3^{rd}$ harmonic band with center frequencies ~66 MHz, for example to detect small gas bubbles.

The back layer can be made with conducting material, for example a mixture of Ag and Pd which can be deposited with tape-casting or thick film printing techniques. The backlayer will then function as an added electrode, which is convenient for some techniques of electrical connection to the transducer, as described below.

The middle of the low frequency band is found where the total thickness of the ceramic and the back layer is ~$\lambda$/2, referred to as $\lambda$/2 resonance. At the middle of the high frequency band, the total thickness of the ceramic and the back layer is ~$\lambda$, referred to as $\lambda$ resonance. In standard transducers with electrodes at the surface of the high impedance region, the electromechanical coupling at the mechanical $\lambda$ resonance is low, because the integral of the electric field across the whole wavelength of the plate thickness is close to zero. However, with the structure in FIG. 3a, the back electrode is found in the middle of the resonant structure, with $\lambda$/2 distance to the front electrode, which provides good electric coupling to the mechanical $\lambda$ resonance.

Figure 4:
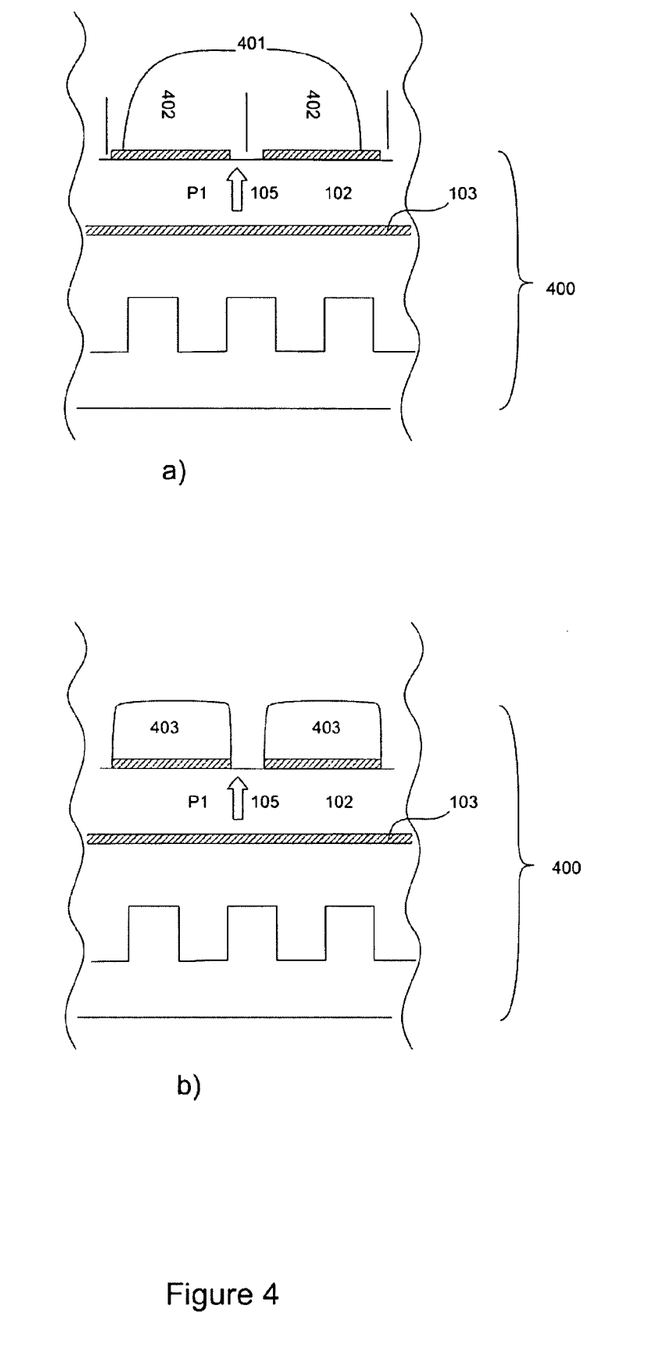
FIG. 4, shows examples of array structures with multiple transducer elements based on ceramic film as the active material, where also structures for multi-band operation is shown.

An ultrasound transducer array can be made as in FIG. 4a, which shows a complete array assembly 400 with similar thickness structure as in FIG. 2a, with the difference that the back electrode is physically split into hot electrodes 401 of the individual array elements 402 defined by the hot electrodes 401. The front electrode 103 is a common ground electrode. An element definition with the electrodes only, without cutting the ceramic material between the elements, provides adequately low acoustic coupling between neighbor array elements, provided the array elements are relatively wide compared to their thickness, and the signal delay between neighboring elements is relatively low. This situation found with switched arrays, and especially with annular arrays.

A lower acoustic coupling between the elements is obtained by separated, added back layers as illustrated in FIG. 4b, with a similar acoustic function as 301 in FIG. 3a. The back layers 403 are deposited only at the hot element electrodes with separation between, and are composed of a material with characteristic impedance close to that of the ceramic. As the back layers have strong influence on the vibration pattern of the structure, the separation of the back layer between the elements reduces the acoustic coupling between the elements. The structure is also interesting for a phased array operation with so large delays between the element signals that one obtains angular direction steering of the beam. The back layer is conveniently deposited onto the ceramic film with thick film printing techniques, followed by sintering. A conducting back layer, for example a mixture of Ag and Pd, then simplifies electrical connection to the hot electrodes.

Figure 5:
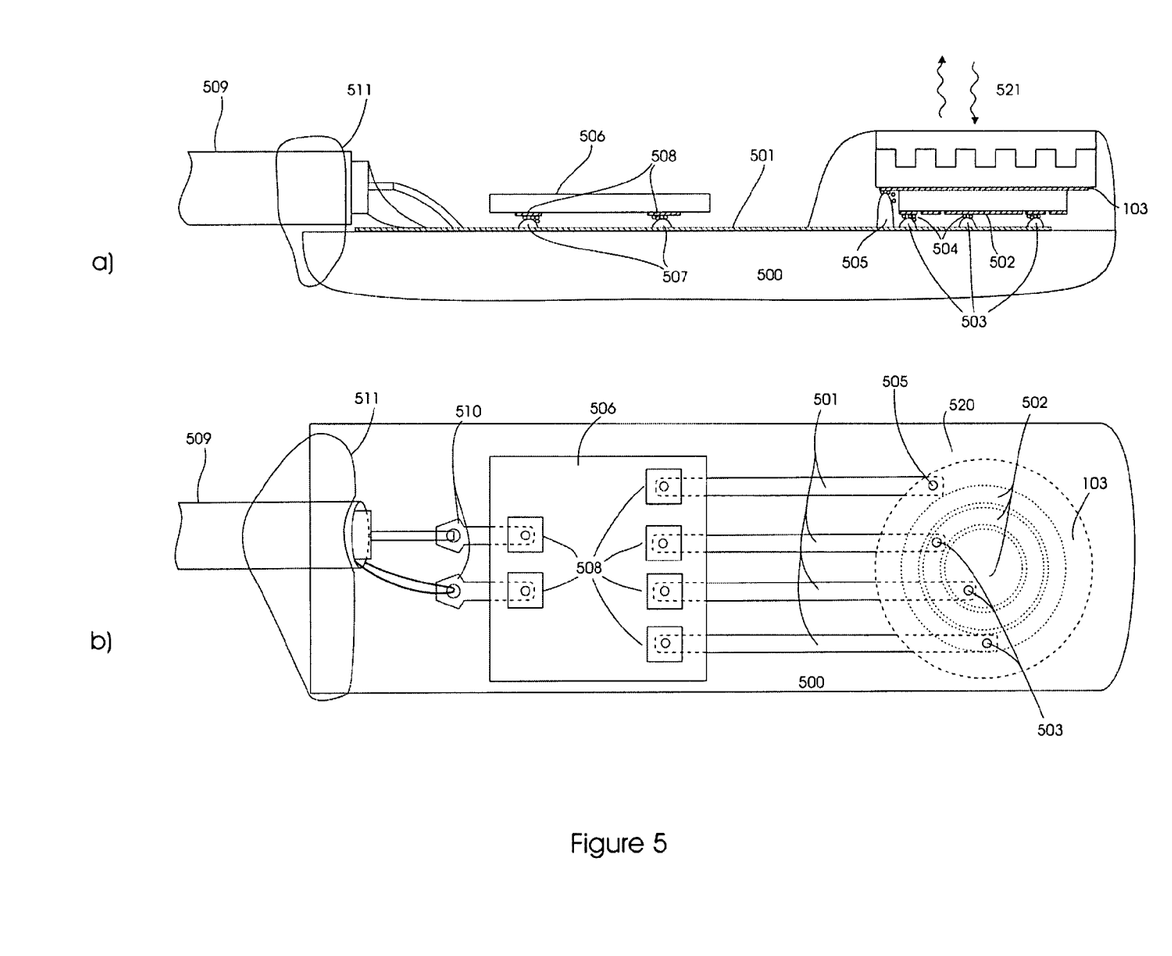
FIG. 5, shows an example according to the invention how electrical connection to the array and cooperating electronic circuits can be made with a conducting glue.

Electrical connection to single element and array transducers, can conveniently be done with a conducting glue technique, where the glue contains small conducting particles (e.g. diam ~10 µm) in an isolating glue substance (particle vol % ~10%). FIG. 5 shows an example embodiment of this technique for an annular array, where FIG. 5a shows a side view and FIG. 5b shows a top view of an array and integrated circuit assembly. Both the array and the integrated circuit are mounted on a polymer based, acoustically absorbing transducer backing material 500 that is coated with a metal conducting film pattern 501 for electrical connection to the element electrodes 502 of the annular array 520. In this particular embodiment the array is indicated with a 3-layer matching as presented in FIG. 2, where the array radiates and receives ultrasound waves through the front surface indicated by the arrows 521. FIG. 5a indicates how the connection points between the film conductors and the element electrodes are obtained with conducting humps 503 (e.g. dimension ~50 µm) on the metal pattern, shown both in FIGS. 5a and 5b. The distance between the element electrodes 502 and the humps 503 is so low that single conducting particles 504 provide electrical connection between the humps and the element electrodes. The front ground electrode 103 is connected to the pattern through an especially tall metal hump 505. Outside the humps, the distance between the electrodes and the metal film pattern is so large that the glue with the particles provide low electrical conductivity between the electrodes and the metal film below. Hence, each film conductor on the surface of the backing connects to a defined electrode at the humps.

The same method is conveniently used to connect the integrated circuit 506 to connecting film pattern 501 that further connects to the transducer array electrodes 103 and 502. Humps 507 on the metal pattern are here made under metal connection pads 508 on the integrated circuit. The integrated circuits can typically be made along the lines described in U.S. Pat. No. 6,540,677 B1, which allows connection to an imaging instrument through a reduced set of connecting wires, down to a single coaxial cable 509. The cable can be connected to the integrated circuit using the same gluing technique through the pads 510 on the circuit on the metal film pattern 501 on the backing. For stress relieve of the cable wires and the circuit, the cable jacket is glued by the block 511 onto the backing material 500.

Figure 6:
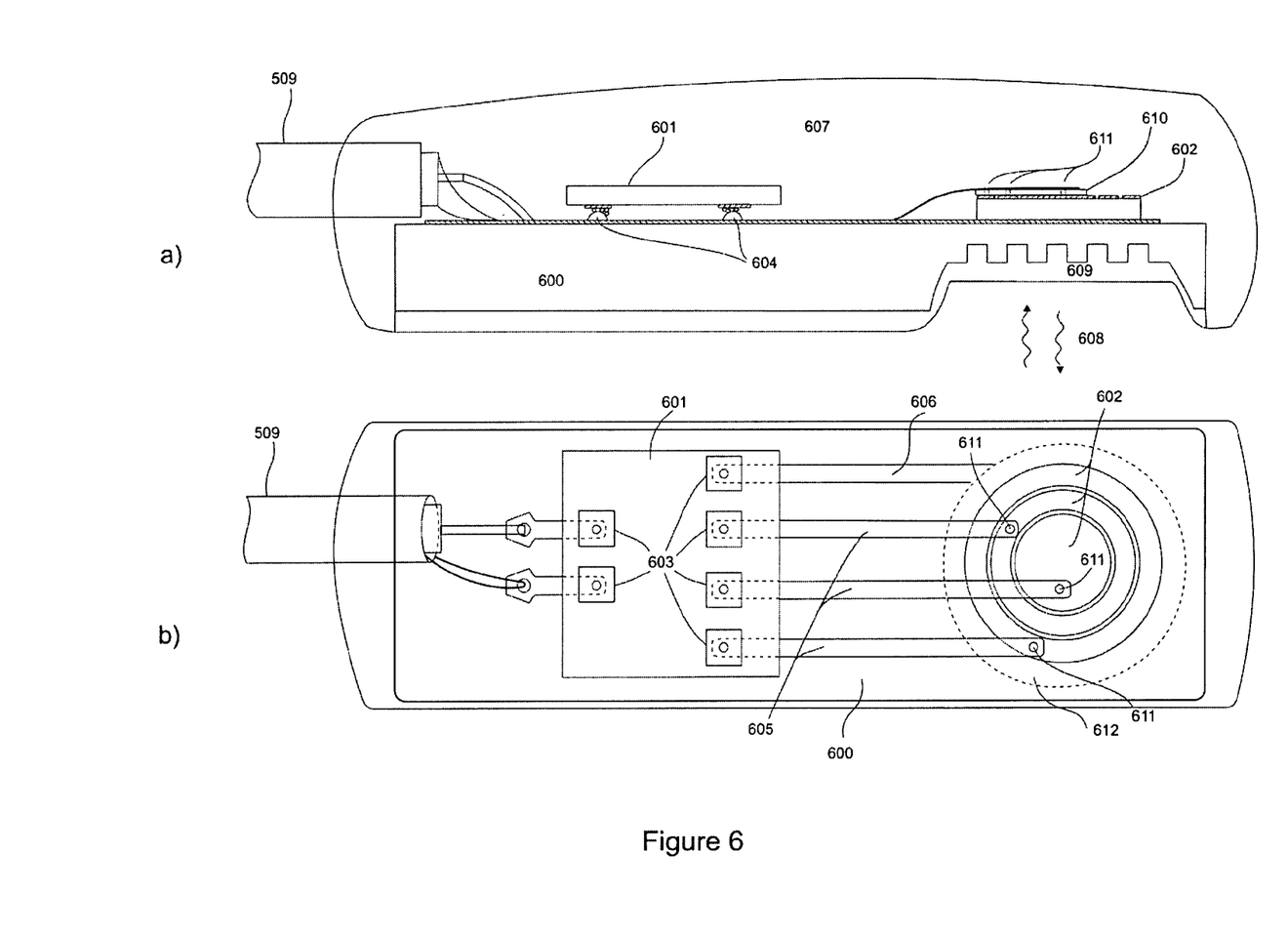
FIG. 6, shows another example according to the invention of connecting the array electrodes to an integrated circuit with a glue containing conducting particles.

Yet another embodiment according to the invention of connecting the transducer and the integrated circuit, is shown in FIG. 6, where FIG. 6a shows a side view and FIG. 6b shows a top view of the embodiment. The electronic circuit 601 is mounted directly on the substrate 600 where the ultrasound transducer array 602 is adhered. The substrate is under the transducer array modified to participate in the load matching network, as described above, so that the transmission and reception of ultrasound waves is through the substrate indicated by the arrows 608. In this particular example is illustrated a 3-layer matching as described in relation to FIG. 2, where the polymer 609 of the acoustic matching layer is spun to coat the whole front face of the substrate. The back side of the assembly is coated with a polymer 607 with especially high acoustic absorption.

The electric connections to the integrated circuit is done at connection pads 603, where connection to a conduction pattern are obtained at conducting humps 604 on a conducting film connector pattern 605, 606, using the conducting glue technique as with the embodiment in FIG. 5. The bottom electrode of the array 612 is used as a common ground electrode and connects via the film conductor 606, while the top electrodes of the individual elements connect to the circuit via film conductors 605. Isolation between these element connection conductors and the array element electrodes can for example be obtained by an isolation film 610 on top of the array element electrodes, and conducting humps 611 on the element electrodes 602 connect the element electrodes through the isolating film 610 to the film conductors 605. Connection to the external cable 509 is in this embodiment similar to that in FIG. 5. The electronic circuit and the array are conveniently coated with an acoustically and electrically isolating polymer 607.

Further variations to the embodiments of FIGS. 5 and 6 can clearly be done within the general scope of the invention. For example is it in some applications pertinent to glue the electronic circuit directly to the back side of the array, making electric contact between the transducer electrodes and the integrated circuit through humps and a conducting glue as described.

Hence, while there have shown and described and pointed out fundamental novel features of the invention as applied to preferred embodiments thereof, it will be understood that various omissions and substitutions and changes in the form and details of the devices illustrated, and in their operation, may be made by those skilled in the art without departing from the spirit of the invention. For example, the presented transfer functions are calculated with a selected set of material parameters and layer thicknesses, and adjustments and improvements in the transfer function characteristics can be obtained by adjustments of the parameters. One should note that according to the principle of the invention, the piezoelectric layers in these Figures could be given different thicknesses for tuning of the active frequency bands to desired requirements. One should also note that the transducer plates could be curved to provide focusing of the ultrasound beam, with negligible modifications in the transfer functions, or lenses could be placed in front of the plates to participate in the focusing of the ultrasound beam.

It is also expressly intended that all combinations of those elements and/or method steps which perform substantially the same function in substantially the same way to achieve the same results are within the scope of the invention. For example, one can group together many element transducers of the type shown into a transducer array according to well known principles. An array of such element transducers can also be obtained by cutting through the film layers with a laser or similar techniques, to divide the transducer into smaller elements grouped side by side to form an array radiating surface.

Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. An ultrasound transducer or transducer array for transmission and reception of bulk ultrasound waves in an acoustic load material through a front face, with a back face on the opposite side, comprising
    an active transducer material including a ferro-electric ceramic film with front and back faces,
    a back electrode on said back face of said ferro-electric ceramic film,
    a film layer on said front face of said ferro-electric ceramic film, said film layer including at least a front electrode, and
    a substrate, said film layer being disposed between said ceramic film and said substrate, wherein said film layer between said ceramic film and said substrate is so dense that diffusion from said substrate to said ceramic film during the manufacturing process is adequately blocked to avoid contamination of said ceramic film by the substrate material,
    wherein a thickness of said film layer between said ceramic film and said substrate is less than $\lambda/10$, where $\lambda$ is the wave length for the bulk ultrasound waves transmitted and received in a thickness direction of said film layer at the highest operation frequencies of the transducer or transducer array, and
    the thickness of said substrate is modified at least in front of said ceramic film through one of etching and grinding techniques, so that
    said modified substrate becomes part of a layered load impedance matching structure between said ceramic film front face and said load material.

2. An ultrasound transducer or transducer array according to claim 1, wherein said ferro-electric ceramic film with electrodes is made with tape-casting techniques and adhered to the substrate after the sintering of said ferro-electric ceramic film.

3. An ultrasound transducer or transducer array according to claim 2, wherein said ceramic film with electrodes is adhered to said substrate through one of gluing, ultrasonic bonding techniques, and anodic bonding techniques.

4. An ultrasound transducer or transducer array according to claim 1, wherein said ferro-electric ceramic film is thick film printed onto said substrate followed by sintering of said ceramic film together with said substrate, and before the printing of said ceramic film, said substrate is covered with a diffusion isolation film that adequately blocks diffusion from said substrate to said ferro-electric ceramic film to avoid contamination of said ceramic film by said substrate, said diffusion isolation film comprising at least a part of said film layer, wherein said film layer includes the front electrode and the diffusion isolation film.

5. An ultrasound transducer or transducer array according to claim 1, wherein said ferro-electric ceramic film is thick film printed onto said substrate followed by sintering of said ceramic film together with said substrate, and said front electrode itself adequately blocks diffusion from said substrate to said ferro-electric ceramic film to avoid contamination of said ceramic film by said substrate.

6. An ultrasound transducer or transducer array according to claim 4, wherein said diffusion isolation film is made of one of said ferro-electric ceramic film material, and $Al_2O_3$, and said front electrode is adhered onto said diffusion isolation film before printing of the ceramic film.

7. An ultrasound transducer or transducer array according to claim 1, wherein said acoustic impedance matching structure is composed of two layers with defined thicknesses to function as acoustic impedance matching layers in a defined frequency band, wherein the $1^{st}$ impedance matching layer close to the ceramic film is the substrate etched or grinded to said defined thickness, and the $2^{nd}$ impedance matching layer close to the load is a polymer film with said defined thickness.

8. An ultrasound transducer or transducer array according to claim 1, wherein said acoustic impedance matching structure is composed of three layers with defined thicknesses to function as matching layers in a defined frequency band, where in a first step the thickness of the combined $1^{st}$ and $2^{nd}$ matching layers closest to said ceramic film are defined by etching or grinding said substrate so that the thickness of the remaining substrate is the sum thickness of said $1^{st}$ and $2^{nd}$ matching layers, and in a second step the individual thickness of said $1^{st}$ and $2^{nd}$ matching layers are defined by etching voids into the substrate leaving intermediate substrate material between the voids, so that said $1^{st}$ matching layer is defined by the whole substrate left after the void etching, and said $2^{nd}$ matching layer is obtained by filling said voids with polymer so that said $2^{nd}$ layer is a composite of substrate material and polymer with thickness defined by the depth of the voids, and said $3^{rd}$ matching layer closest to the load is made as a film of polymer with the defined thickness.

9. An ultrasound transducer or transducer array according to claim 1, wherein the etching of the substrate is performed by chemical techniques.

10. An ultrasound transducer or transducer array according to claim 1, wherein the etching of the substrate is performed by sputter etching techniques.

11. An ultrasound transducer or transducer array according to claim 1, wherein the substrate is made of one of silicon (Si), aluminum (Al), a glass material, fused silica, and magnesium (Mg).

12. An ultrasound transducer or transducer array according to claim 11, wherein the acoustic load matching structure is composed of three layers, and said substrate at the adhesion of the ceramic film and electrodes to the substrate has correct thickness for the sum of the $1^{st}$ and $2^{nd}$ matching layer thicknesses, said $2^{nd}$ matching layer is further manufactured by etching voids in the substrate and filling said voids with polymer to form said $2^{nd}$ matching layer as a composite of substrate and polymer material with thickness given by the depth of the voids in the substrate, and the thickness of said $1^{st}$ matching layer is defined by the whole substrate film that is left after etching said voids, and said $3^{rd}$ matching layer is made as a polymer film on top of said $2^{nd}$ matching layer.

13. An ultrasound transducer or transducer array according to claim 1, wherein the matching layer closest to the load material is a polymer adhered through spin coating techniques.

14. An ultrasound transducer or transducer array according to claim 1, wherein array elements are defined by separated hot electrodes on the back face of the transducer film, and the front electrode is a common electrode for all of the elements.

15. An ultrasound transducer or transducer array according to claim 14, wherein each of the separated hot electrodes has a thickness so that it significantly participates in the definition of the thickness resonance of the array element.

16. An ultrasound transducer or transducer array according to claim 15, wherein the back element electrodes have a thickness so that the transducer array has a lower active frequency band where the total thickness of said electrodes and ceramic film is approximately $\lambda/2$ and a higher active frequency band where the total thickness of said electrodes and ceramic film is approximately $\lambda$.

17. An ultrasound transducer or transducer array according to claim 1, wherein the back face is covered with one of an acoustically absorbing material, an air filled chamber, and a vacuum chamber.

18. An ultrasound transducer or transducer array for transmission and reception of bulk ultrasound waves in an acoustic load material through a front face, with a back face on the opposite side, comprising an active transducer material including a ferro-electric ceramic film with front and back faces, a back electrode on said back face of said ferro-electric ceramic film, a film layer on said front face of said ferro-electric ceramic film, said film layer including at least a front electrode, and a substrate, said film layer being disposed between said ceramic film and said substrate, wherein a thickness and a density of said film layer between said ceramic film and said substrate are configured to block diffusion from said substrate to said ceramic film during a sintering process and to thereby avoid contamination of said ceramic film by said substrate material during the sintering process, wherein the thickness of said film layer between said ceramic film and said substrate is less than $\lambda/10$, where $\lambda$ is the wave length for the bulk ultrasound waves transmitted and received in a thickness direction of said film layer at the highest operation frequencies of the transducer or transducer array, and the thickness of said substrate is modified at least in front of said ceramic film through one of etching and grinding techniques, so that said modified substrate becomes part of a layered load impedance matching structure between said ceramic film front face and said load material.

* * * * *